US005910737A

United States Patent [19]

Kesler

[11] Patent Number: 5,910,737

[45] Date of Patent: Jun. 8, 1999

[54] INPUT BUFFER CIRCUIT WITH DIFFERENTIAL INPUT THRESHOLDS OPERABLE WITH HIGH COMMON MODE INPUT VOLTAGES

[75] Inventor: Scott Birk Kesler, Kokomo, Ind.

[73] Assignee: Delco Electronics Corporation, Kokomo, Ind.

[21] Appl. No.: 08/885,036

[22] Filed: Jun. 30, 1997

[51] Int. Cl.[6] .......................... H03K 5/153; H03K 5/159

[52] U.S. Cl. ............................... 327/89; 327/52; 327/65; 327/77

[58] Field of Search ................................ 327/52, 53, 56, 327/65, 66, 72, 83, 89, 77, 403, 407, 415; 330/252, 253, 261

[56] References Cited

U.S. PATENT DOCUMENTS

| | | | |
|---|---|---|---|
| 3,178,592 | 4/1965 | Fischer et al. | 327/52 |
| 3,422,283 | 1/1969 | Murray et al. | 327/52 |
| 3,436,560 | 4/1969 | Marchais | 327/83 |
| 3,585,487 | 6/1971 | McNally | 327/403 |
| 3,976,952 | 8/1976 | Shaver | 327/52 |
| 4,072,870 | 2/1978 | Davis | 327/65 |
| 4,602,168 | 7/1986 | Single | 327/65 |
| 4,739,194 | 4/1988 | Glasby | 330/261 |
| 5,057,788 | 10/1991 | Ushida et al. | 330/261 |
| 5,121,004 | 6/1992 | Kesler et al. | 326/124 |

*Primary Examiner*—Timothy P. Callahan
*Assistant Examiner*—An T. Luu
*Attorney, Agent, or Firm*—Jimmy L. Funke

[57] ABSTRACT

An electrical input buffer circuit is provided for receiving an input signal such as an electronic spark timing signal and providing an output signal despite the presence of noise. The input buffer circuit receives a control signal and a reference voltage signal, and the voltage potential therebetween provides a differential input. A voltage divider network is coupled between the inputs for producing a first voltage potential and a second voltage potential in response to the differential input. A differential pair of NPN type transistors compares the control signal to a threshold value. The input buffer circuit produces an output high or low signal as a function of the input control voltage and is allowed to operate above and below local ground.

12 Claims, 2 Drawing Sheets

INPUT BUFFER CIRCUIT WITH DIFFERENTIAL INPUT THRESHOLDS OPERABLE WITH HIGH COMMON MODE INPUT VOLTAGES

BACKGROUND OF THE INVENTION

1. Technical Field

This invention relates to circuitry for receiving data from a transmission line and, more particularly, to such an electrical input buffer circuit that may interface an automotive control module and remote electronic drive circuitry.

2. Discussion

Ignition systems for automotive vehicles commonly employ an engine control module (ECH) and remote electronic ignition drive circuitry provided in an ignition module The function of the ignition drive circuitry is to provide switching and current limit control of ignition coil currents which are fed to the ignition coil for purposes of producing spark in the cylinders of the engine. In automotive vehicles, the ignition drive circuitry is commonly located in the immediate proximity of the ignition coil at the engine.

The drive voltage that commands the ignition system "on" has generally been transmitted on a single wire which is referenced to the vehicle ground. One problem that arises with conventional approaches is that the ignition module may be affected by noise since the ignition module is often located very close to the spark plugs on the engine The ignition system conducts high currents in the ignition coils in order to provide enough energy to create the necessary spark These high ignition currents can travel through conductors in the ignition module and out a wiring harness back to a ground reference This may cause the development of some undesirable induced voltage drop across the ground reference wires. Ground variations in the electrical interface between the engine control module and the ignition module due to these high currents in the ignition coil can result in ground differences of greater than two volts. As a consequence, the single-ended drive signal may become less attractive since the input voltage is consumed by noise induced signals appearing across the ground reference wire. In effect, the ground reference rises above the signal of the ground that the engine control module is utilizing to provide the drive signal.

To eliminate noise induced on the ground line, separate reference voltage lines can be used to set the ground for each individual ignition module. However, the presence of separate reference voltage lines requires additional wiring which increases the wiring costs and requires added IC input area. In addition, if the voltage on the transistors and resistors is below the substrate voltage of the IC, the required isolation between the ground reference and the IC may dissipate. It is therefore desired to have an integrated circuit device that can operate much below ground.

Another problem that arises with the integrated circuitry is that the circuitry is required to operate from temperatures as low as minus forty degrees (40°) celsius to temperatures as high as one-hundred-sixty-five degrees (165°) celsius. Despite variances within such a large temperature operating range, it is generally required that the voltage threshold for the integrated circuitry should not deviate with temperature changes. In order to meet this temperature requirement, the circuitry must provide temperature compensation since many of the parametrics of the integrated circuitry change with temperature. For example, resistors are known to vary in resistance as temperature changes. Similarly, the base-to-emitter voltage on transistors generally swing as the temperature changes.

One example of an input buffer circuit that provides hysteresis with temperature compensation is described in U.S. Pat. No. 5,121,004, entitled "Input Buffer with Temperature Compensated Hysteresis and Thresholds Including Negative Input Voltage Protection", issued on Jun. 9, 1992. The aforementioned U.S. patent is owned by the Assignee of the present application and is incorporated herein by reference. The input buffer circuit of the above-identified patent utilizes first and second temperature dependent currents, one having a negative temperature coefficient and the other having a positive temperature coefficient such that the sum effect of the temperature coefficient on the circuit is substantially zero. The above approach receives a single-ended input and utilizes local grounds as the reference. While the above approach provides adequate hysteresis and temperature compensation, that approach is limited in that it may not be able to detect the input signal when the reference is below the local ground. This is increasingly significant for ignition systems which transmit higher currents and are located very close to the engine.

It is therefore desirable to provide for an electrical input buffer circuit that is capable of receiving transmitted data from a transmission line and provides an output signal despite the presence of noises it is particularly desirable to provide for an electrical input buffer circuit which may interface between an automotive engine control module and a remote electronic ignition drive circuit that is located near the automotive ignition coils and the engine. It is further desirable to provide for such a circuit implemented in integrated circuitry that is capable of operating above and below ground. It is also desirable to provide for such an integrated circuit that compensates for temperature deviations within the integrated circuitry.

SUMMARY OF THE INVENTION

In accordance with the teachings of the present invention, an electrical input buffer circuit is provided for receiving an input signal and providing an output signal despite the presence of noise. The input buffer circuit includes a first input for receiving an electrical control signal and a second input for receiving a reference voltage signals The voltage potential between the control signal and the reference voltage signal provides a differential input. A voltage divider network is coupled between the first and second inputs for producing a first voltage potential and a second voltage potential in response to the differential input. A differential pair of NPN type transistors compares the control signal to a threshold value and has a resistor coupled between the emitters of the differential pair of transistors and the second input. The input buffer circuit produces an output high or low signal as a function of the input control voltage and is allowed to operate above and below local ground.

According to a preferred embodiment, the input buffer circuit receives an electronic spark timing (EST) control signal and determines whether the EST control signal is high or low. The input buffer circuit is preferably provided as an integrated circuit where multiple channels may share a common reference voltage The output high or low signal is applied to the ignition coil to produce the necessary voltage applied to spark plugs of an engine without allowing noise to adversely effect the transmission of the EST control signal.

BRIEF DESCRIPTION OF THE DRAWINGS

Other objects and advantages of the present invention will become apparent to those skilled in the art upon reading the following detailed description and upon reference to the drawings in which.

DETAILED DESCRIPTION OF THE PREFERRED EMBODIMENT

Figure 1:
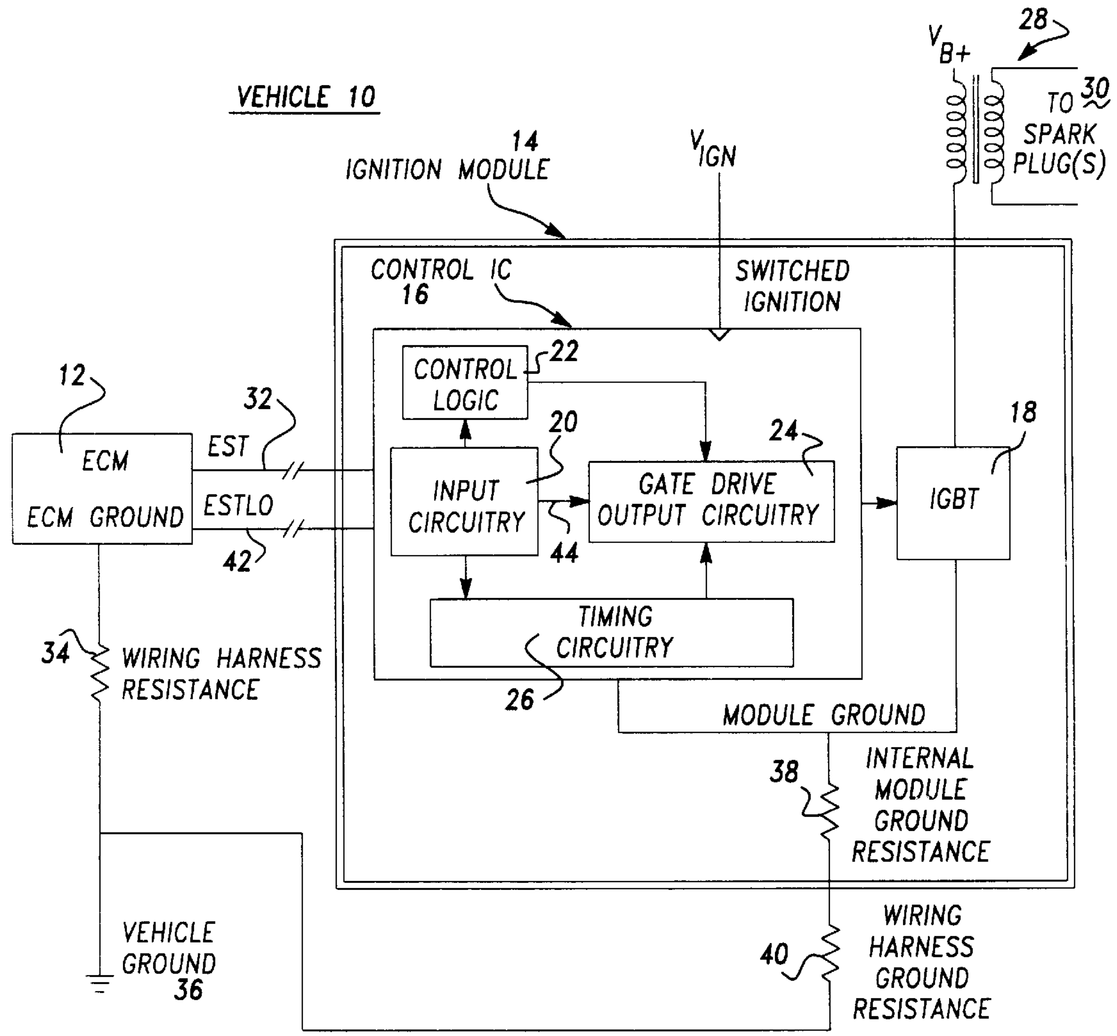
FIG. 1 is a block diagram illustrating an ignition module containing an electrical input buffer circuit for interfacing an automotive engine control module and a remote electronic ignition drive circuit in accordance with the present invention.

Turning now to FIG. 1, an automotive vehicle is generally indicated by block 10 to include an automotive engine control module (ECM) 12, an ignition module generally indicated by block 14, and ignition coils 28 for generating the spark provided by spark plugs 30 of an automotive internal combustion engine. The ignition module 14 includes control circuitry 16 which is preferably provided as an integrated circuit (IC). The control circuit 16 receives an electronic spark timing (EST) signal from the engine control module, processes the EST signal; and outputs a control signal that is used to control the timing of spark generated by ignition coil 28 and coil spark plugs 30.

The engine control module 12 generates the electronic spark timing (EST) signal according to normal engine control operation as should be evident to one skilled in the art. The engine control module 12 further generates an ESTLO reference signal that is referenced to the engine control module ground. The ground employed by the engine control module 12 is acquired from vehicle ground 36 through a wiring harness that includes some wiring harness resistance 34. The engine control module 12 outputs the electronic spark timing (EST) signal on line 32 and further outputs the ESTLO reference signal on line 42.

The EST signal and ESTLO reference signal provide a differential output that is not perturbed by high ignition coil currents which are generally present near the engine.

The ignition module 14 receives the differential voltage signal provided by the EST signal and ESTLO reference signal on lines 32 and 42, respectively, both of which are received by the input buffer circuit 20. According to the present invention, the input buffer circuit 20 processes the EST signal and the ESTLO reference signal and provides an output control signal on line 44. The output control signal on line 44 is processed by gate drive output circuitry and used to switch the ignition coil "on" and "off".

The electrical input buffer circuit 20 is included in the control integrated circuitry 16 and is therefore likewise implemented in integrated circuitry. The input buffer circuit 20 is capable of receiving the transmitted data in pseudo-differential form from a single-ended transmission line where a ground reference line may be shared between multiple copies of the same circuit on a single integrated circuit. The input buffer circuit 20 is capable of receiving transmitted data in the presence of high levels of common mode voltage relative to the substrate ground of the integrated circuit.

The control integrated circuit 16 also includes control logic 22 and timing circuitry 26. The control integrated circuit 16 further includes gate drive output circuitry 24 for receiving and processing the output 44 of the input buffer circuit 20, while further receiving output signals from both the control logic 22 and timing circuitry 26. The control integrated circuit 16 further receives a voltage signal $V_{IGN}$ which is the switched ignition voltage supply, and has a module ground that is referenced to the vehicle ground 36 via an internal module ground resistance 38 and a wiring harness ground resistance 40. The output of the control integrated circuit 16 is fed to an insulated gate bipolar transistor (IGBT) 18 which in turn provides a control signal that switches "on" and "off" to control voltage to the ignition coil 28. In response to the controlled switching, the ignition coil 28 generates a high voltage signal that produces spark in the corresponding spark plug 30 of the vehicle engine to produce the necessary spark for engine ignition.

Figure 2:
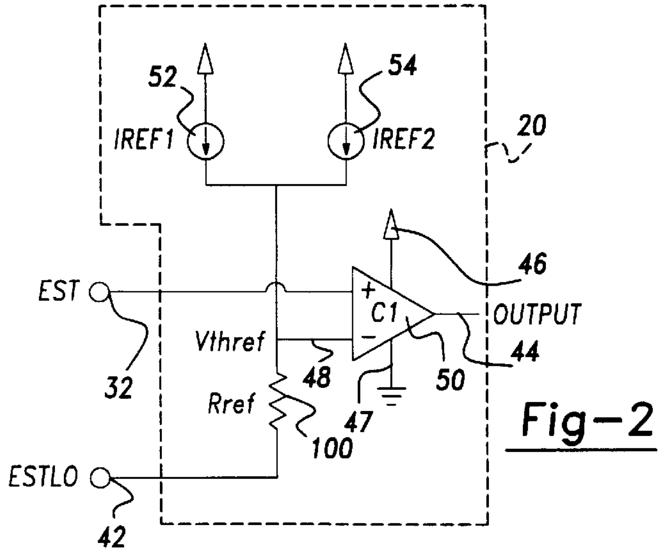
FIG. 2 is a circuit diagram illustrating the electrical input buffer circuit for determining the logic state of an incoming EST signal.

Referring to FIG. 2, the input buffer circuit 20 is generally illustrated therein. The input buffer circuit 20 according to the present invention includes a comparator (C1) circuit 50 having a non-inverting (+) input coupled to line 32 for receiving the electronic spark timing (EST) signal. The comparator circuit 50 also has an inverting (−) input coupled to line 48 for receiving a voltage identified as $V_{thref}$. The ESTLO reference signal is fed via line 42 to reference resistor ($R_{REF}$) 100 which in turn is coupled to line 48. Line 48 further receives a current mirror generated signal via current sources 52 and 54. Current sources 52 and 54 produce currents IREF1 and IREF2, respectively, and provide temperature compensation to the integrated circuitry as will be described herein. The comparator circuit 50 further includes a supply line 46 and a ground 47 and produces output control signal 44.

The input voltage EST on line 32 is compared to the internal reference voltage $V_{thref}$ which is developed across resistor $R_{ref}$ 100. The voltage on resistor $R_{ref}$ is generated by a combination of reference currents IREF1 and IREF2. Resistor $R_{ref}$ 100 is connected to line 42 to receive the input ground reference signal ESTLO. As the input ground reference signal ESTLO moves up and down relative to the IC substrate ground, the magnitude of the EST signal relative to ESTLO signal can still be compared to the reference voltage $V_{thref}$ without regard to the IC substrate ground. The comparator circuit 50 input voltages may be at potentials below the substrate ground reference, and therefore it is preferred that all devices internal to comparator circuit 50 be chosen such that there are no unwanted forward biased semiconductor junctions.

To achieve an input threshold that is independent of temperature, current sources 52 and 54 are chosen such that the sum of the two currents IREF1 and IREF2, respectively when forced across resistor $R_{ref}$ 100, develops a voltage that does not change with changing temperatures Resistor $R_{ref}$ 100 as well as other resistors (not shown) that are used to develop the currents IREF1 and IREF2 are integrated silicon resistors which are known to have significant temperature coefficients and therefore vary with temperature. Diffused silicon resistors typically have increasing values with increasing temperature. As a results the combination of currents IREF1 and IREF2 have a decreasing magnitude with increasing temperature so that the voltage threshold $V_{thref}$ is temperature flat and therefore temperature compensated. Accordingly, the currents IREF1 and IREF2 compensate for temperature dependent components in the circuitry to provide an input threshold that is independent of temperature.

Figure 3:
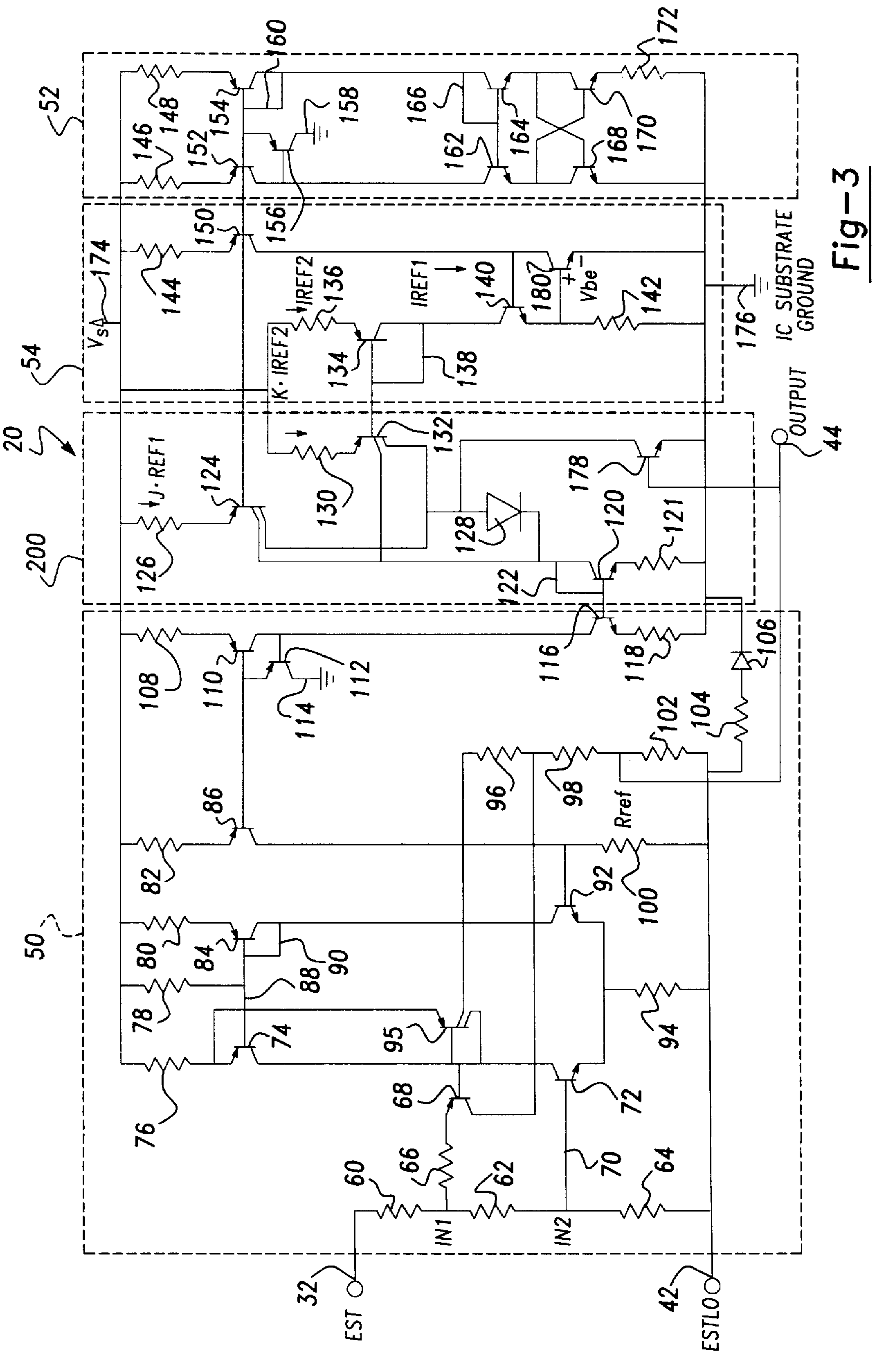
FIG. 3 is a more detailed circuit diagram illustrating the electrical input buffer integrated circuit in accordance with the present invention.

With particular reference to FIG. 3, the input buffer circuit 20 according to the present invention is illustrated in more detail. According to the preferred embodiment, the comparator circuit 50 is configured to include resistors 60, 62 and 64 coupled in series between lines 32 and 42 and configured such that a first node IN1 is formed between resistors 60 and 62, while a second node IN2 is formed between resistors 62 and 64. Should the EST signal line 32 become disconnected from the input terminal, the resistance provided by resistors 60, 62 and 64 will operate to pull the input node low, thereby causing the output to assume an "off" (low) state. When used in connection with a control input to an automotive ignition system as explained herein, this is important so as to prevent the destruction of the ignition coil or coil current control elements due to any excessive heating that may result from being left "on" continuously. Resistors 60, 62 and 64 may be either internal to the integrated circuit 20 or may be provided external thereto. However, if provided external, the relative ratios of resistors 60, 62 and 64 may be adjusted to provide an external means of adjusting the effective input threshold. Furthermore, if external, the combined impedance of resistors 60, 62 and 64 will be less dependent on temperature, and will likely not depend on the IC processing variables. On the other hand if resistors 60, 62 and 64 are provided internal to the IC, the number of external components that are required will be reduced, thereby reducing the circuit cost.

The comparator circuit 50 includes a PNP transistor 68 having an emitter coupled to node IN1 via resistor 66. Comparator circuit 50 also includes transistors 72 and 92 which are NPH type transistors preferably formed by diffusing an n-type emitter diffusion into a p-type base diffusion that resides inside of an n-type epi pocket for proper isolation of the transistors 72 and 920 The epi pockets which form the collectors of the transistors 72 and 92 are required to be at a potential greater than the substrate p-type material. If the epi voltages fall below substrate potential, the substrate-epi junction becomes forward biased and the transistor isolation is lost. For this reason, the collectors of transistors 72 and 92 are tied to approximately one PNP $V_{be}$ voltage (approximately 0.75 volts at 25 degrees celsius) below supply voltage by connecting the respective collectors of transistors 72 and 92 to the corresponding bases of PNP type transistors 84 and 74. The emitters of transistors 84 and 74 are tied to supply through resistors 76 and 800 With the connections as described above, the device terminals which will be allowed to go below substrate ground are the two ends of resistor 94, resistors 60, 62 and 66, the emitter of transistor 68 and the base and emitter terminals of transistors 72 and 92. The terminals of the transistors are preferably protected from disruption by reverse biased junctions between the terminals and the p-type substrate. The resistors are protected from disruption by biasing the epi pockets in which they reside to supply voltage.

The comparator circuit 50 further includes a PNP type transistor 74 having a collector coupled to the base of transistors 68 and 95 and the collector of transistor 72. Transistor 95 has an emitter coupled to the emitter of transistor 74, a base coupled to the base of transistor 68 and a pair of split collectors. One of the split collectors of transistor 95 is tied back to its base, while the other of the split collectors is coupled to output 44 with resistors 96 and 98. The emitter of transistor 84 is coupled to voltage $V_s$ supply line 174 via resistor 80, while the collector is coupled the collector of transistor 92 and also coupled via line 90 back to the base of transistor 84. Transistors 74 and 84 are commonly connected at the respective bases via line 88 and the bases are also coupled to the voltage $V_s$ supply 174 via resistor 78.

The comparator circuit 50 further includes a PNP type transistor 110 with a base commonly coupled to the base of transistor 86, and the emitter coupled to resistor 108. A PNP type transistor 112 is also provided with a base and emitter coupled to the collector and base, respectively, of transistor 110, while the collector of transistor 112 is tied to ground via line 114. In addition, the base of transistor 112 and the collector of transistor 110 are both coupled to the collector of an NPN type transistor 116 which has an emitter connected to resistor 118. The base of transistor 116 in turn is connected to a current mixer and hysteresis control circuit identified by reference numeral 200.

Comparator circuit 50 also has resistors 96, 98 and 102 which are coupled to the second split collector of transistor 95. Resistor $R_{ref}$ 100 is connected between the collector of transistor 86 and ESTLO input line 42. Resistor $R_{ref}$ 100 is also coupled to the base of transistor 92. In addition, resistor 104 and diode 106 provide a fail safe reference for the ESTLO signal in the event that the ESTLO signal input connection is lost. If the input connection is lost, the internal potential of ESTLO reference signal becomes the IC substrate ground plus the voltages across resistor 104 and diode 106. While switching thresholds may not remain as designed, if most of the system parameters are nominal and there is not too much system difference between the ECM ground and IC substrate ground, normal switching of the buffer output will continue to occur. This in turn will provide a potential "limp home" mode as part of an automotive ignition modules.

If the base of transistor 72 is at a potential higher than the base of transistor 92, transistor 72 will conduct current through the base-emitter junction of transistor 95 whose split collectors are tied to the collector of transistor 72 and the output 44 via resistors 96 and 98 of the comparator circuit 50. According to the present invention, comparator circuit 50 has the emitter of transistor 95 tied to the low side of resistor 76 which in turn is connected to voltage $V_s$ source 174. One of the split collectors of transistor 95 is tied back to the base of transistor 95. By connecting transistor 95 in this fashion, the supply current consumed by the comparator circuit 50 is limited by redirecting current that would have passed through the emitter of transistor 74 to the output. The additional drop across resistor 76 tends to turn "off" transistor 74, thereby allowing transistor 95 to have a more effective base drive from transistor 72.

With the collector of transistor 95 tied back to its base, the gain of the output drive is limited to one, which serves to reduce the supply current draw even further. The collector of transistor 72 has a current which is defined by the voltage at the base of transistor 72 minus the base-emitter voltage of transistor 72 divided by the resistance value of resistor 94. In the case of increasing base voltage of transistor 72 which occurs with increasing EST voltage, the collector current of transistor 72 increases proportionally. The gain limiting collector-base tie-back connection of transistor 95 reduces the current that may otherwise increase.

Transistor 68 provides the high level "on" output state of the comparator circuit 50 in the event that the voltage in the base of transistor 72 should approach the comparator supply voltage In the automotive environment, the EST signal source in the engine control module may be derived from a supply different from that supplying current to the input buffer circuitry 20. Accordingly, it is possible that the buffer input voltage could exceed the buffer supply voltage in this situation. If the buffer input voltage exceeds the buffer supply voltage transistor 72 could saturate and the output current drive generated by transistor 95 may decrease, possibly allowing the buffer output to assume a low state even though the input is above the threshold voltage. In this bias condition, transistor 68 has a base-emitter junction that becomes fully forward biased and transistor 68 directs input current from node IN1 to the buffer circuit output 44, therefore maintaining the high level output state.

In addition, transistor 95 is preferably constructed with a partial concentric collector which is an additional p-type ring provided around a portion of the transistor. If transistor 95 begins to saturate, the concentric collector ring picks up current that would normally flow to the substrate as a result of a parasitic PNP transistor between the collector, epi, and substrate As a consequence, current is redirected back to the transistor base, thereby reducing the drive to the transistor and eliminating wasted substrate current. To aid in the forcing of this situation under low supply or an excessively high EST voltage, resistors 96, 96 and 102 are chosen so as to develop sufficient drop to force transistor 95 into a limited saturation condition, thereby causing the supply current to be reduced.

The current mixer and hysteresis control circuit 200 combines currents IREF1 and IREF2 and provides hysteresis to avoid undesirable switching Coupled to the current mixer and hysteresis control circuit 200 is the current source generator circuit 54 which produces current IREF2. Current source generator circuit 54 is further coupled to current source generator circuit 52 which produces current IREF1.

Current source generator circuit 52 includes NPN type transistors 168 and 170. The collector of transistor 168 is coupled to the base of transistor 170, while the collector of transistor 170 is connected to the base of transistor 168. The emitter of transistor 168 is coupled to the IC substrate ground 176, while the emitter of transistor 170 is coupled to the IC substrate ground via resistor 172. Current source generator circuit 52 further includes a pair of base coupled NPN type transistors 162 and 164. The emitter of transistor 162 is coupled to the collector of transistor 168, while the emitter of transistor 164 is coupled to the collector of transistor 170. Also, the collector of transistor 164 is tied to the base of transistors 162 and 164 via line 166.

Current source generator circuit 52 also includes PNP type transistors 152 and 154 which are connected via the corresponding bases to form a PNP current mirror. The collector of transistor 152 is coupled to the collector of transistor 162, while the collector of transistor 154 is coupled to the collector of transistor 164. A PNP type transistor 156 is shown with a base coupled to the collector of transistor 152, an emitter coupled to the base of transistors 152 and 154, and a collector tied to ground via line 158. Also, the collector of transistor 154 is coupled to the base of transistors 152 and 154.

The integrated circuit voltage $V_s$ supply 174 supplies voltage $V_s$ to the emitters of respective transistors 152 and 154 via resistors 146 and 148, respectively. The integrated circuit voltage $V_s$ supply 174 is also applied to the emitter of a PNP transistor 150 via resistor 1445 while the base of transistor 150 is coupled to the base of transistor 152. The collector of transistor 150 supplies the current IREF1 output which is applied to the second current source generator circuit 54.

The first current source generator circuit 52 generates a delta-$V_{be}$ current identified as current IREF1 Current IREF1 can be mathematically described according to one embodiment by the following equation:

$$I_{REF1} = \frac{V_t \times \ln(9)}{R},$$

where voltage $V_t$ is the thermal voltage which may be described as Boltzman's constant (K) multiplied by temperature (T) in degrees Kelvin and divided by the electronic charge (q). The thermal voltage $V_t$ has a positive temperature coefficient of a pproximately 87 microvolts per degree celsius according to one example. R represents the resistance of resistor 172. The overall temperature coefficient of the current IREF1 is then dependent upon the specific temperature coefficient of the diffused silicon resistor which is identified by reference numeral 172. While a typical silicon process gives a positive temperature coefficient for diffused resistors, the net combination of the positive temperature coefficient of the thermal voltage $V_t$ and the positive temperature coefficient for resistor 172 results in an overall positive temperature coefficient for current IREF1.

Since the current IREF1 has a positive temperature coefficient, the current IREF2 has a negative temperature coefficient which may be determined as a function of the value of resistor $R_{ref}$ 100. Current source generator circuit 54 receives the first current IREF1 from the collector of transistor 150. Current source generator circuit 54 has an NPN type transistor 180 with the collector receiving the current IREF1 and with an emitter coupled to the base of transistor 180 and to the IC substrate ground 176. The voltage drop across the base-to-emitter of transistor 180 is identified as $V_{be}$. Current source generator circuit 54 further includes an NPN type transistor 140 with a base coupled to the collector of transistor 180 and an emitter coupled to the IC substrate ground 176 via resistor 1420 Current source generator circuit. 54 also includes a PNP type transistor 134 with a collector coupled to the collector of transistor 140 and has an emitter coupled to the integrated circuit voltage $V_s$ supply 174 via resistor 136. Transistor 134 further has a connector 138 tied between the collector and the base thereof. Current flow into the emitter of transistor 134 is defined as current IREF2. It should be appreciated that the current IREF2 may be dependent upon ratio values J and K as will be further explained hereinafter.

The current IREF2 is developed by imposing a bipolar HPH transistor base-to-emitter voltage $V_{be}$ across a resistor of the same type as resistor $R_{ref}$. The NPN transistor base-to-emitter voltage $V_{be}$ has a negative temperature coefficient. Since the resistance of resistor 142 increases with temperature, the current through resistor 142, which is defined by base-to-emitter voltage $V_{be}$ divided by resistor 142, will decrease as temperature increases. The current flow through resistor 142 is turned around using a PNP current mirror formed by transistors 132 and 134 thereby forming current IREF2.

The current mixer and hysteresis control circuit 200 includes a PNP type split collector transistor 124 with an emitter coupled to the voltage $V_s$ supply 174 via resistor 126 and further contains a pair of split collectors. Transistor 124 has a base coupled to the base of transistor 150. The current mixer and hysteresis control circuit 200 also includes PNP type split collector transistor 132 with an emitter coupled to the voltage $V_s$ supply 174 via resistor 130. Transistor 132 has a base coupled to the base of transistor 134 and further has a pair of split collectors both coupled to the pair of split collectors of transistor 124. One collector of transistor 124 and one collector of transistor 132 are both fed to diode 128 which in turn has an output coupled to the collector of an MPH type transistor 120. Transistor 120 is coupled to the IC substrate ground 176 via resistor 121 and has a base coupled to the base of transistor 116 to form an NPN current mirror. The collector of transistor 120 is coupled back to its base. In addition, current mixer and hysteresis control circuit 20 includes an NPN type transistor 178 having a collector coupled to the input of diode 128 and an emitter coupled to the IC substrate ground 176. Transistor 178 has its base coupled to output line 44.

When the current IREF1 and current IREF2 are selected and combined directly and applied across resistor $R_{REF}$ 100, the resulting voltage $V_{thref}$ can be presented by the following equation:

$$V_{thref} = \left[J \times \left[\frac{V_t \times \ln(9)}{R1}\right] + K \times \left[\frac{V_{be}}{R2}\right]\right] \times R_{ref},$$

where R1 is the resistance of resistor 172 and R2 is the resistance of resistor 142. The resistance values form ratios that will not vary with varying resistor process variations assuming all of the resistors are formed of the same silicon diffused resistor material. As a result, a reference voltage is generated that is independent of resistor process parameters, and the temperature coefficient of the reference voltage is dependent only upon the temperature coefficient of the thermal voltage $V_t$, which is a constant, and the temperature coefficient of the NPN base-to-emitter voltage $V_{be}$. The magnitudes of the temperature coefficients are scaled by ln(9) factor and by the ratios of resistor $R_{ref}$ to resistor 172 (R1) and resistor $R_{ref}$ to resistor 142 (R2).

In order to sum the two different currents IREF1 and IREF2 such that the combination has a nearzero temperature coefficient, it may be necessary to scale each of the currents IREF1 and IREF2 independently. Scaling can be achieved by creating a current mirror ratio greater than or less than 1, in the current mirrors that replicate the reference currents for injection into resistor $R_{ref}$. The control ratio may be handled by varying the PNP transistor area and PEP emitter resistor ratios in a manner which should be readily understood to one skilled in the art. The ratios are referred to herein as J and K for current IREF1 and current IREF2, respectively.

To achieve a desired value of voltage $V_{thref}$ that is temperature independent can be accomplished by solving the above equation such that the derivative with respect to temperature is equal to zero, while maintaining the DC condition of the desired voltage $V_{thref}$ magnitude. To do so, it may require knowledge of the temperature coefficient characteristics of the NPN base-to-emitter voltage $V_{be}$ for the particular silicon process employed, but does not necessarily require knowledge of the temperature coefficients of the diffused resistors.

Since the automotive electrical environment is noisy especially one involving close proximity to an engine ignition coil, it is desirable to provide some degree of hysteresis in order to effectively realize solid switching of the subsequent electronic circuits without hazard of oscillation about a switching threshold. According to the present invention, hysteresis is provided by subtracting equivalent fractions of current IREF1 and current IREF2 from the current that is imposed on resistor $R_{ref}$. By removing equivalent fractions of currents IREF1 and IREF2, the overall temperature coefficient of the lower threshold generated by the reduced currents flowing through resistor $R_{ref}$ should be identical to the temperature coefficient of the primary threshold Control of the removal of the fractional amounts of current IREF1 and IREF2 is directly coupled to the output of the input comparator in a manner such that results in the input threshold being reduced once the primary threshold has been crossed.

The hysteresis switch works as follows. When the input signal EST is below the primary thresholds the output of comparator C1 is "off", and therefore transistor 178 is "off". With transistor 178 "off", the current from both of the collectors of transistor 124 enters the collector of transistor 120. Half of the current of each of transistors 124 and 132 reaches transistor 120 after passing through diode 128. The other half of the current is transferred directly to transistor 120. The sum of all of the emitter current of transistor 124 and all of the emitter current of transistor 132 is mirrored via the NPN current mirror composed of transistors 120 and 116. An additional scaling of the current, for example a three-to-one reduction in current, may occur with this NPN current mirror. The reduction of current is to reduce the total amount of supplied current required by the input buffer. The mirrored and scaled sum of the current of transistors 124 and 132 is mirrored again by PNP current mirror transistors 86 and 110 and then forced onto resistor $R_{ref}$ to thereby develop the threshold reference voltage $V_{thref}$. The additional current mirroring operations performed by PNP current mirror transistors 86 and 110, as well as NPN current mirror transistors 118 and 120 are provided to allow ESTLO and therefore the voltage on resistor $R_{ref}$ and portions of comparator C1 to be either above or below the IC substrate ground. Once the voltage at EST has become greater than the primary threshold established by $V_{thref}$, the output of comparator C1 switches "on" (high) and subsequently turns on transistor 178. Transistor 178 directs one-half of the emitter current of transistor 124 and one-half of the emitter current of transistor 132 to ground. Diode 128 reverse biases and prevents the remaining current of transistors 124 and 132 from being directed to ground. The current which ultimately reaches resistor $R_{ref}$ is only one-half of what it was when EST was below the primary threshold.

For comparator C1 to turn "off", the voltage on EST must drop below the new lower threshold voltage established across resistor $R_{ref}$. The difference between the two thresholds is the amount of hysteresis. A two-to-one division of currents at transistors 124 and 132 has been chosen, however, any equal fractional subtraction of parts of transistors 124 and 126 total current can be used. The amount of current reduction is a function of how much hysteresis is desired. According to one example, transistors 124 and 132 have one-quarter split collectors and transistor 178 directs one-quarter of each of the currents of transistors 124 and 132 to ground. However, the scope of this invention is intended to include any choice of current reduction by transistor 178.

Accordingly, the present invention provides for an input buffer circuit 20 with the ability to sense input voltages that are above or below substrate ground and which are preferably limited only by the collector-emitter breakdown voltages of transistors 72 and 92. In addition, the input buffer circuit 20 of the present invention provides temperature independent input thresholds and hysteresis as well as current consumption limiting features created by the unique connection of transistor 95. The input buffer circuit 20 further guarantees a high level output under the condition of an excessively high input voltage and provides protection from reference line disconnections.

Accordingly, the input buffer circuit 20 of the present invention receives an input control signal EST and a reference voltage ESTLO and determines the high or low state of the input control signal despite variances with local ground and noise from the surrounding environment. The input buffer circuit 20 of the present invention is advantageously employed in connection with buffering an electronic spark timing (EST) control signal for controlling spark timing of an engine in an automotive vehicle. However, it should be appreciated that other applications and/or modifications of the input buffer circuit 20 are possible without departing from the principles of the present invention.

While this invention has been disclosed in connection with a particular example thereof, no limitation is intended thereby except as defined in the following claims. This is because a skilled practitioner recognizes that other modifications can be made without departing from the spirit of this invention after studying the specification and drawings.

What is claimed is:

1. An electrical input buffer integrated circuit operable with inputs above and below an integrated circuit local ground, said circuit comprising:

a first input for receiving an electrical control signal;

a second input for receiving a reference voltage signal, said control signal and reference voltage signal providing a differential input;

an integrated circuit ground input for receiving a local ground;

a comparator including a differential pair of NPN type transistors having commonly connected emitters for comparing the control signal to a threshold value;

a comparator biasing resistor coupled between the commonly connected emitters of the differential pair of transistors and the second input, wherein the comparator biasing resistor receives the reference voltage signal from the second input; and an output for producing an output signal as a function of the input differential voltage despite inputs above and below the local ground.

2. The circuit as defined in claim 1 further comprising a voltage divider network coupled to the first input for producing a first voltage potential in response to the differential input.

3. The circuit as defined in claim 1 wherein the electrical control signal is an electronic spark timing signal and the output of the circuit controls spark ignition for an engine.

4. An input buffer circuit with temperature compensation and hysteresis, said input buffer circuit comprising:

a first input for receiving an input voltage signal;

a second input for receiving a reference voltage, said input voltage signal and reference voltage signal providing a differential input;

a comparator circuit for comparing a voltage that is a function of the differential input with a threshold voltage;

a first temperature current generator generating a first temperature dependent current having a positive temperature coefficient;

a second temperature dependent current generator generating a second temperature dependent current having a negative temperature coefficient, the positive and negative coefficient of the first and second temperature dependent currents offsetting the temperature coefficient of the various components of the input buffer circuit;

a current mixing circuit for mixing the first temperature dependent current and the second temperature dependent current;

an NPN type current mirror for receiving the mixed current and providing an output;

a PNP type current mirror coupled to the output of the NPN type current mirror, said PNP type current mirror providing an output for providing a temperature compensated signal, wherein the threshold voltage varies in accordance with the temperature compensated signal; and an output coupled to the comparator circuit for providing an output signal as a function of the differential input.

5. The input buffer circuit as defined in claim 4 wherein said reference voltage is controlled as a function of the output of the PNP type current mirror.

6. The input buffer circuit as defined in claim 4 wherein said PNP type current mirror includes a first PNP type transistor having a base coupled to a second PNP type transistor, said second PNP type transistor having a collector coupled to a resistor for establishing a temperature independent voltage as the reference voltage.

7. An input buffer circuit with supply current limiting control, said input buffer circuit comprising:

a first input for receiving an input voltage signal;

a second input for receiving a reference voltage, said input voltage and reference voltage signal providing a differential input;

a comparator including a differential pair of transistors for comparing the differential input with a reference value, said comparator further including a split collector transistor having an emitter receiving supply current, a first collector, and a second collector coupled to a base of the split collector transistor for limiting supply current flow through the split collector transistor; and an output coupled to the first collector of the split collector transistor for producing an output signal as a function of the differential input.

8. The input buffer circuit as defined in claim 7 wherein the split collector transistor further includes a concentric collector ring.

9. The input buffer circuit as defined in claim 7 wherein said supply current is received via a resistor.

10. The input buffer circuit as defined in claim 7 further comprising a transistor having an emitter coupled to the resistor and further coupled to the emitter of the split collector transistor, such that the split collector transistor limits the amount of supply current passing through the integrated circuit.

11. An input buffer circuit with a voltage protection bypass, said input buffer circuit comprising:

a first input for receiving an input voltage;

a voltage divider circuit for dividing the input voltage into a first divided voltage and a second divided voltage, wherein said first divided voltage has a voltage potential higher than the second divided voltage;

a transistor based comparator for receiving the second voltage and comparing the second voltage with a threshold voltage, said transistor based comparator providing an output as a function of the comparison;

an output terminal coupled to the output of the transistor based comparator for providing an output signal; and a bypass path coupled to the voltage divider for receiving the first divided voltage and including a bypass transistor, said bypass transistor providing an output drive current to the output terminal when the transistor based comparator saturates due to an excessively high second divided voltage such that the output drive current is derived from the first divided voltage.

12. A differential input buffer circuit having open circuit reference line protection, said differential input buffer circuit comprising:

a first input for receiving an input voltage;

a second input for receiving a reference voltage, said input voltage and reference voltage providing a differential input voltage;

a differential pair of transistors forming a comparator for comparing the differential input voltage to a threshold voltage;

an output terminal coupled to the output of the differential pair of transistors;

an integrated circuit substrate ground; and a bypass path including resistance and a diode coupling the second input to the integrated circuit substrate ground such that the second input line is directly connected to the integrated circuit substrate ground via the bypass path when the second input voltage exceeds the integrated circuit substrate ground by a predetermined threshold.

* * * * *